United States Patent
Coyne

(10) Patent No.: US 9,935,628 B2
(45) Date of Patent: Apr. 3, 2018

(54) FET—BIPOLAR TRANSISTOR COMBINATION, AND A SWITCH COMPRISING SUCH A FET—BIPOLAR TRANSISTOR COMBINATION

(71) Applicant: Analog Devices Global, Hamilton (BM)

(72) Inventor: Edward John Coyne, Athenry (IE)

(73) Assignee: Analog Devices Global, Hamilton (BM)

( * ) Notice: Subject to any disclaimer, the term of this patent is extended or adjusted under 35 U.S.C. 154(b) by 0 days.

(21) Appl. No.: 14/937,705

(22) Filed: Nov. 10, 2015

(65) Prior Publication Data
US 2017/0134019 A1  May 11, 2017

(51) Int. Cl.
| | |
|---|---|
| *H01L 29/73* | (2006.01) |
| *H01L 29/06* | (2006.01) |
| *H03K 17/567* | (2006.01) |
| *H01L 27/02* | (2006.01) |
| *H01L 29/735* | (2006.01) |
| *H03K 17/16* | (2006.01) |

(52) U.S. Cl.
CPC ....... *H03K 17/567* (2013.01); *H01L 27/0266* (2013.01); *H01L 29/735* (2013.01); *H03K 17/165* (2013.01); *H03K 17/168* (2013.01)

(58) Field of Classification Search
None
See application file for complete search history.

(56) References Cited

U.S. PATENT DOCUMENTS

| | | |
|---|---|---|
| 4,306,145 A | 12/1981 | Hill |
| 4,688,161 A | 8/1987 | Covington |
| 5,659,190 A | 8/1997 | Litwin |
| 6,015,982 A | 1/2000 | Soderbarg |
| 8,736,343 B2 | 5/2014 | Chen et al. |
| 9,209,091 B1 | 12/2015 | Harper et al. |
| 2003/0160281 A1* | 8/2003 | Chen .................. H01L 29/0619 257/339 |
| 2005/0067630 A1 | 3/2005 | Zhao |
| 2007/0013021 A1* | 1/2007 | Zhang ................. H01L 29/0692 257/500 |
| 2008/0191238 A1 | 8/2008 | Madathil et al. |
| 2011/0101417 A1* | 5/2011 | Ogura ................. H01L 29/0834 257/139 |
| 2011/0175642 A1 | 7/2011 | Chen |

(Continued)

FOREIGN PATENT DOCUMENTS

| | | |
|---|---|---|
| EP | 2996246 | 3/2016 |
| WO | WO 01/61951 | 8/2001 |

OTHER PUBLICATIONS

Gillot, C., et al., "Wafer Level Thin Film Encapsulation for MEMS," 2005, 4 pages.

(Continued)

*Primary Examiner* — Seahvosh Nikmanesh
*Assistant Examiner* — Xiaoming Liu
(74) *Attorney, Agent, or Firm* — Knobbe, Martens, Olson & Bear, LLP

(57) ABSTRACT

A transistor switch device is provided that exhibits relatively good voltage capability and relatively easy drive requirements to turn the device on and off. This can reduce transient drive current flows that may perturb other components.

20 Claims, 16 Drawing Sheets

(56) References Cited

U.S. PATENT DOCUMENTS

2015/0021682 A1    1/2015  Bobde et al.

OTHER PUBLICATIONS

Vincent, et al., "V-JFET Transistors for over voltage protection in power device series connected applications," Proceedings of the 18th International Symposium on Power Semiconductor Devices & IC's Jun. 4-8, 2006 Naples, Italy, 4 pages.

* cited by examiner

FET—BIPOLAR TRANSISTOR COMBINATION, AND A SWITCH COMPRISING SUCH A FET—BIPOLAR TRANSISTOR COMBINATION

BACKGROUND

Technical Field

The present disclosure relates to a combination of a field effect transistor and a bipolar transistor.

Description of Related Technology

There is a need to be able to switch high voltages, typically up to, and in the 1200 Volt range. Applications for switches in this range include motor control and inverters amongst other things. Such switching can be achieved by the use of insulated gate bipolar transistors, IGBTs. The IGBT has been very successful. However it is not without its own problems. Therefore there remains a need for an improved semiconductor switch operable over a range of voltages, including voltages in excess of 1000 Volts.

SUMMARY OF CERTAIN INVENTIVE ASPECTS

According to a first aspect of this disclosure, there is provided a current flow control device, comprising a bipolar transistor in combination with a field effect transistor. The bipolar transistor is arranged in series with the field effect transistor. A first region of semiconductor is shared by the bipolar transistor and the field effect transistor. This in turn means that a smaller transistor can be used to provide the base current. Accordingly, a parasitic capacitance and an input node of the drive transistor can be much reduced, leading to smaller transient current.

Such an arrangement can allow the field effect transistor to be responsible for bearing most of the voltage drop across the current flow control device in an off state. This in turn can allow the bipolar transistor to be formed in a higher gain configuration than is found in IGBTs. Accordingly, the size of the drive current for the bipolar transistor can be reduced.

BRIEF DESCRIPTION OF THE DRAWINGS

The teachings of the present disclosure will be described, by way of non-limiting example, with reference to some embodiments of those teachings in conjunction with the accompanying Figures in which.

DETAILED DESCRIPTION OF CERTAIN EMBODIMENTS

Figure 1:
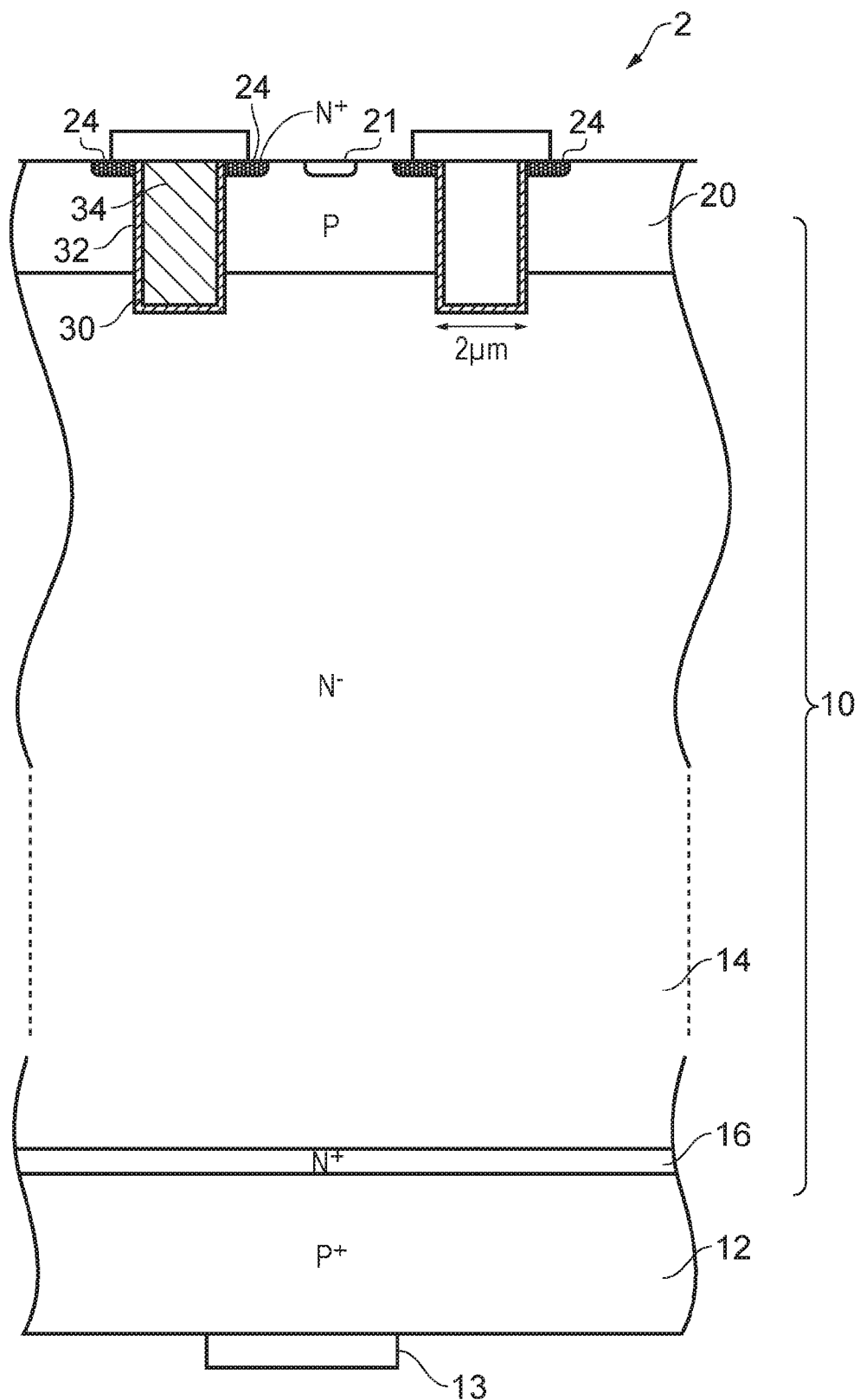
FIG. 1 is a cross section through a prior art vertical IGBT for the purposes of placing the present teachings in context.

The following detailed description of certain embodiments presents various descriptions of specific embodiments. However, the innovations described herein can be embodied in a multitude of different ways, for example, as defined and covered by the claims. In this description, reference is made to the drawings where like reference numerals may indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Some transistor structures are shown in the Figures. Various regions of different doping concentrations and dopant types are shown in the Figures and are denoted by boundary lines for diagrammatic convenience. It should be appreciated that due to the doping techniques used the boundaries may be diffuse regions. Furthermore, terms such as "vertical" refer to a device as orientated in the appropriate figure or figures.

FIG. 1 schematically illustrates the configuration of a prior art vertical IGBT 2. IGBTs can be formed horizontally or vertically. Forming the transistor vertically reduces its footprint on the wafer and hence the cost of the transistor, although this does come with the inconvenience of having to make a contact to the back of the wafer. Horizontal transistors can have all their connections on the surface of the wafer but as a result take up a larger area at the surface of the wafer, and hence are more costly. The transistor shown in FIG. 1 comprises a handle wafer 12 which is P type doped and to which a metal contact 13 is made. An N type region 14 of semiconductor is provided over the P type handle wafer 12. The region 14 is often grown by epitaxial deposition and may be relatively thick, often over 100 microns in high voltage devices. The region 14 is often relatively lightly doped and is designated $N^-$ in FIG. 1 whereas the region 12 is quite heavily doped and is designated $P^+$. Often a region 16 is formed between the $P^+$ handle wafer 12 and the $N^-$ epitaxial layer 14 and is more highly N type doped that the region 14. This layer 16 helps prevent punch through. A P type region 20 is formed over the $N^-$ epitaxial layer 14. Thus the structure is that of a vertical PNP transistor 10. A highly doped $P^+$ region 21 may be provided to facilitate contact between a metal conductor and the P region 20.

The large depth of region 14, which forms the base of the transistor gives the transistor the ability to withstand high potential differences between the layer 12, which forms an emitter and the layer 20 which forms the collector. The maximum voltage that the device can stand scales substantially linearly with the depth of the base layer. However a thick base region also tends to give rise to a low current gain, with the current gain β often being close to unity. Thus the high voltage PNP transistor shown in FIG. 1 has the advantage of being able to act as a switch and withstand high voltages, but the penalty that it incurs is a large base current if it is desired to pass a large collector current.

Figure 2:
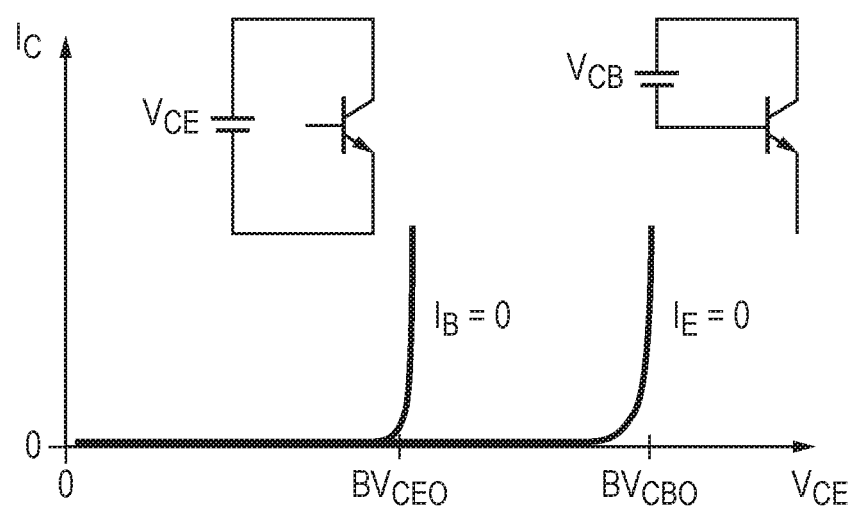
FIG. 2 shows the circuit configurations used to characterize $BV_{CEO}$ and $BV_{CBO}$ for bipolar transistors.

It is known from the literature relating to bipolar transistors that the transistor breakdown voltage $BV_{CE0}$ which is the collector to emitter breakdown voltage with the base open is related to $BV_{CBO}$, which is the collector to base breakdown voltage of a common emitter transistor with the emitter floating. The relative circuit configurations and breakdown voltages are shown in FIG. 2. The relationship between $BV_{CE0}$ and $BV_{CBO}$ is given by the following $$BVCE0 = BVCBO/(1/\beta)^{\wedge}(1/m) \qquad \text{Eqn. 1}$$

Where β=current gain and
m=4 for NPN and 2 for PNP silicon transistors.

Thus for good breakdown performance a low gain is highly desirable.

In order to address this problem of low current gain a field effect transistor, FET, is provided to drive the base current. The drive FET could be provided as a separate device. However a more compact implementation is to provide the drive FET within the collector region of the PNP transistor. The user can only drive the load presented by the gate of the drive FET rather than supply the current provided by the low gain bipolar transistor. The drive FET can be provided such that an N type drain region of the FET is formed by the N type region 14 of the bipolar transistor. An N type doping 24 is provided in part of the P type layer 20 so as to form a source terminal of the FET. In order to form a gate, a trench 30 is formed that extends from the surface of the device to the N⁻ layer 14. The trench is lined by a dielectric 32 such as oxide, nitride or polyamide, and the trench is then filled with a conductive material 34 to form a gate electrode. The conductive material may, for example, be a metal or doped polysilicon.

The regions 24 are in contact with the material 20 forming the collector of the PNP transistor and can take current from the surface of layer 20 and, by virtue of the voltage of the gate depleting the P type material adjacent the insulator 32 and thereby forming a N type channel adjacent the insulator 32, current can be supplied to the base region to turn the bipolar transistor on.

Figure 3:
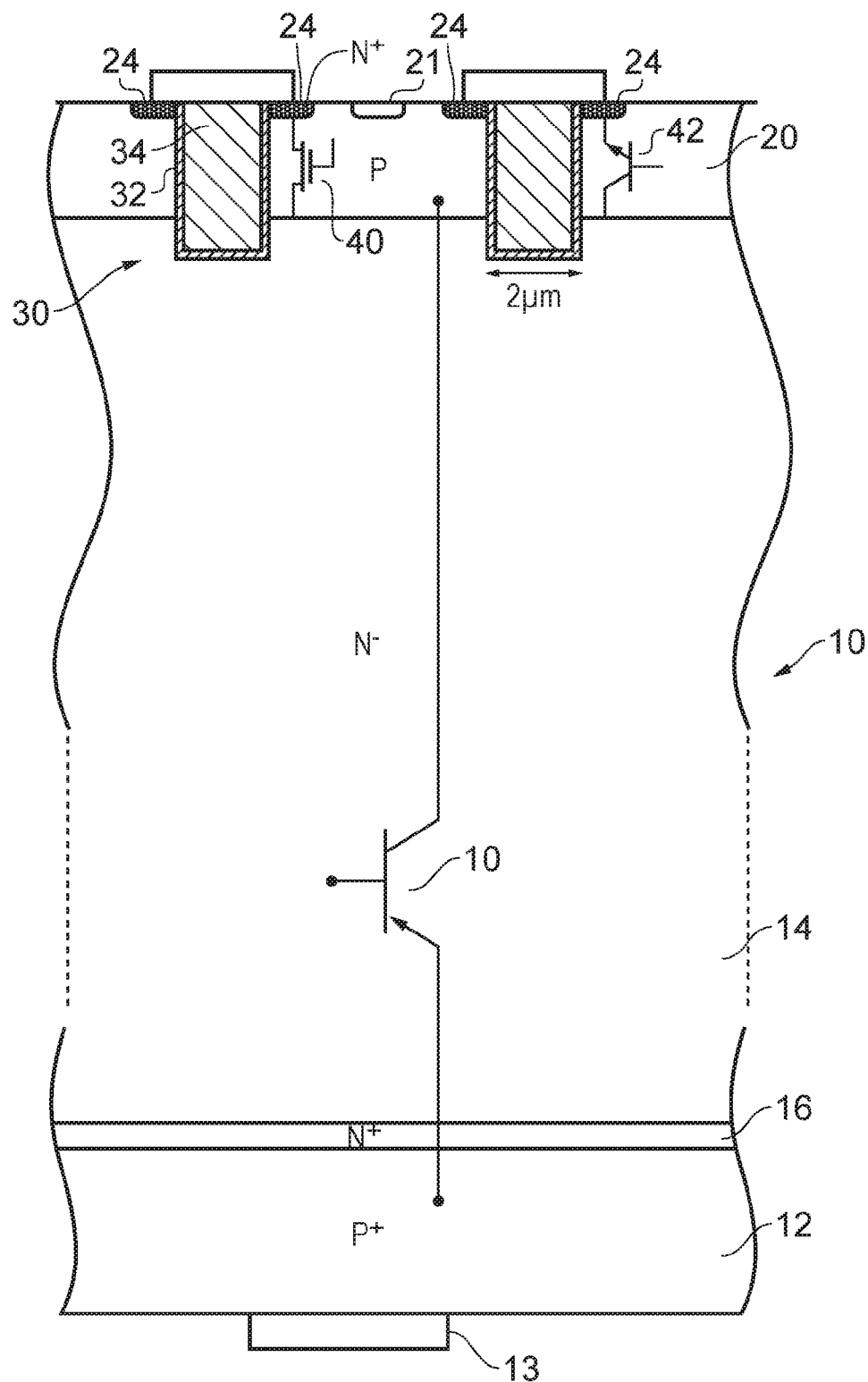
FIG. 3 shows the position of parasitic components within the transistor shown in FIG. 1.
Figure 4:
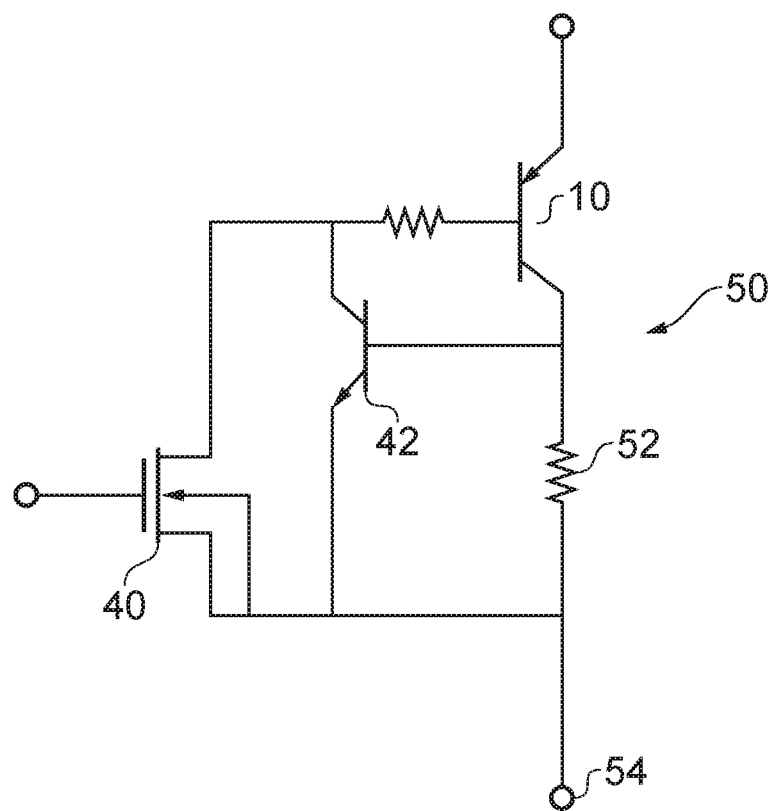
FIG. 4 is an equivalent circuit of the transistor of FIG. 3.

FIG. 3 superimposes the circuit symbol for a drive FET 40 onto the structure shown in FIG. 1 so as to show the effective position of the FET 40 in an IGBT. The position of the PNP transistor is also shown and designated 10. However FIG. 3 also shows that N type region 24, P type region 20 and N type region 14 also form a vertical NPN transistor 42. The vertical NPN transistor is a parasitic component which when included in an equivalent circuit diagram for the structure of FIG. 1, as shown in FIG. 4, illustrates the potential for the PNP transistor 10 to interact with the parasitic NPN transistor 42 to form a parasitic thyristor 50. If the parasitic thyristor 50 switches into a conducting state then control of the IGBT is lost and the device will remain conducting irrespective of the control voltage applied to the gate terminal of the device.

Figure 5:
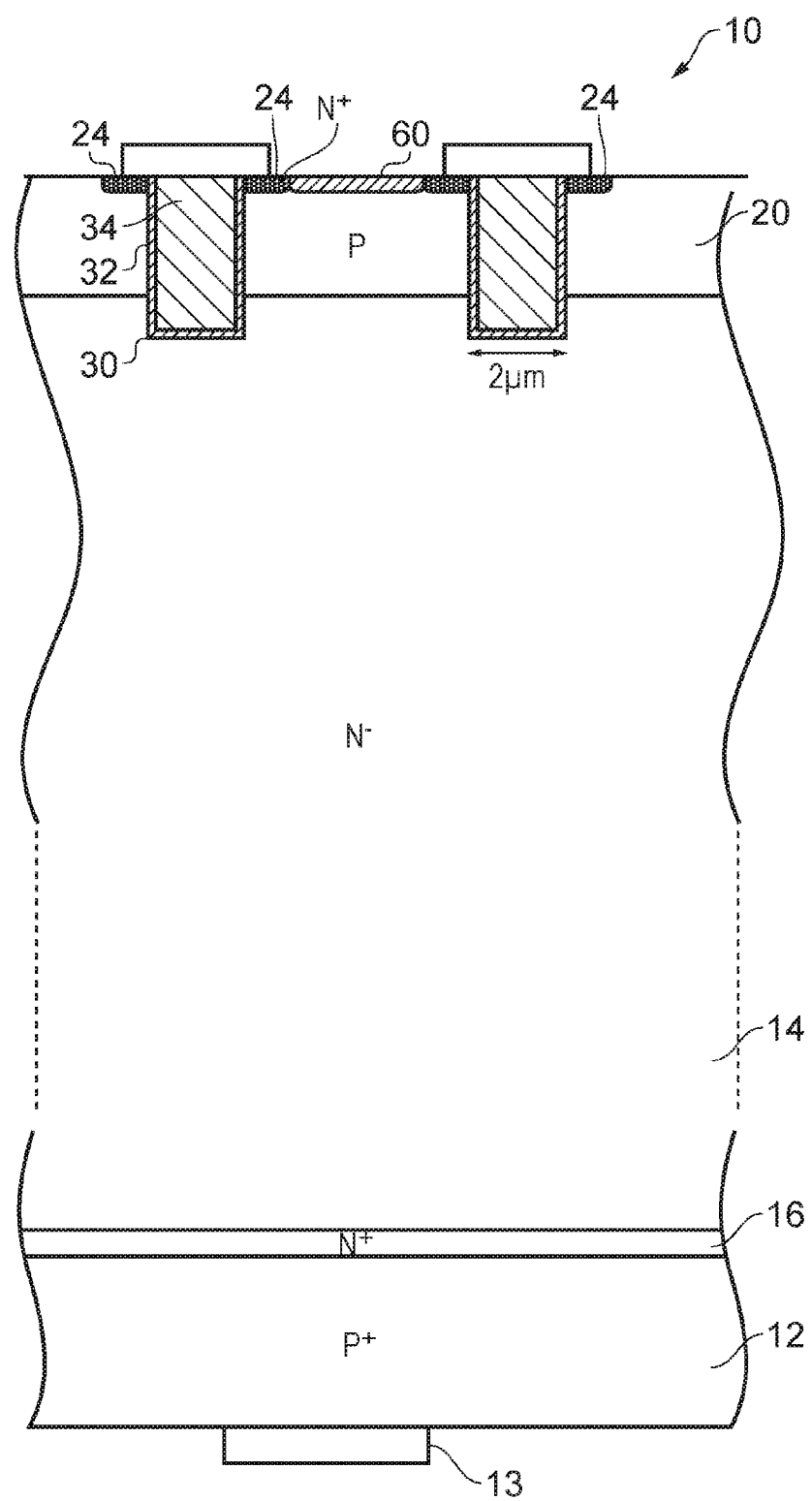
FIG. 5 shows a known modification to the arrangement of FIG. 1 so as to reduce the risk of parasitic components causing the transistor to latch up.

Prior art work on IGBTs has focused on preventing the parasitic thyristor 50 from turning on. Primarily efforts have focused on minimizing the resistance 52 of the silicon that forms the parasitic resistor 52 between the base of the parasitic transistor 42 and a device collector node 54. This has been done, as shown in FIG. 5 by making the N type region 24 abut a highly doped P⁺ type region 60 which forms the collector contact to a metal layer (not shown). Both regions 24 and 26 may be in contact with the metal layer.

Thus the embedded drive FET can supply the base current for the PNP transistor. The IGBT has been a successful device, and the ability to convert the drive signal from a large value current, as would have been required by the PNP bipolar transistor, to a gate voltage has significantly benefited circuit designers.

However the drive FET 40 should be relatively sizable to supply the large base current as the current gain is close to unity. As a result the drive FET of the IGBT has a relatively large gate, which in turn has a relatively large gate capacitance. A consequence of this is that to switch the IGBT on and off quickly (as can be highly desirable to save it spending time in a high power dissipation regime where it is passing a large current while being exposed to a large voltage drop) then the gate inrush current may still need to reach several Amperes, albeit for a short duration. Lower current give rise to slower switching times.

In order to reduce the gate drive current it would be desirable to reduce the gate capacitance. This can be done by making the drive FET smaller, but in turn this can reduce the current that can be supplied to the base of the bipolar transistor. The bipolar transistor base current requirement could be reduced by increasing its current gain, but this can cause the break-down voltage to plunge. Thus the IGBT designer is faced with trading off gate current against breakdown voltage. As the market for IGBTs is high voltage control, there has been little progress in reducing drive FET size over the 30 or so years that the IGBT has existed, and hence the gate current to switch the IGBT has also remained large.

A new architecture is provided herein to improve performance of high voltage switching devices.

The inventor has realized that it is possible to inject carriers into a fully depleted region of semiconductor. This counter intuitive observation lead the inventor to develop a device where a bipolar transistor structure is modified to have a fully depleted region within it when it is in an off (non-conducting) state. It is common when dealing with transistor structures, such as field effect transistors to regard a fully depleted region as not supporting conduction because, for example, use of depleting the channel of a FET is made to turn the device off so as to inhibit current flow between its drain and source regions. However the inventor realized that it would be possible to bias a FET into pinch off so as to drop a large voltage across the FET but still be able to inject carriers into the depleted region such that current could flow through the device could be initiated. Furthermore the current flow as a result of the carriers causes the FET to turn on such that it no longer drops a large voltage across the region of semiconductor that previously had been depleted, and hence the device is not subject to relatively large amounts of power dissipation because the effective on resistance $R_{ON}$ of the device becomes relatively small.

In an embodiment of the present disclosure a FET is formed in series with a bipolar transistor, in such a way that the collector of the bipolar transistor opens into the channel region of the FET. This FET can be considered as a voltage dropping FET as it can reduce the voltage seen by the bipolar transistor from the supply voltage to a pinch off voltage for the voltage dropping FET. The bipolar transistor can either be driven as if the device as a whole was a bipolar transistor, or alternatively the bipolar transistor can still be associated with an input/drive FET arranged to provide the base current for the bipolar transistor.

Figure 6:
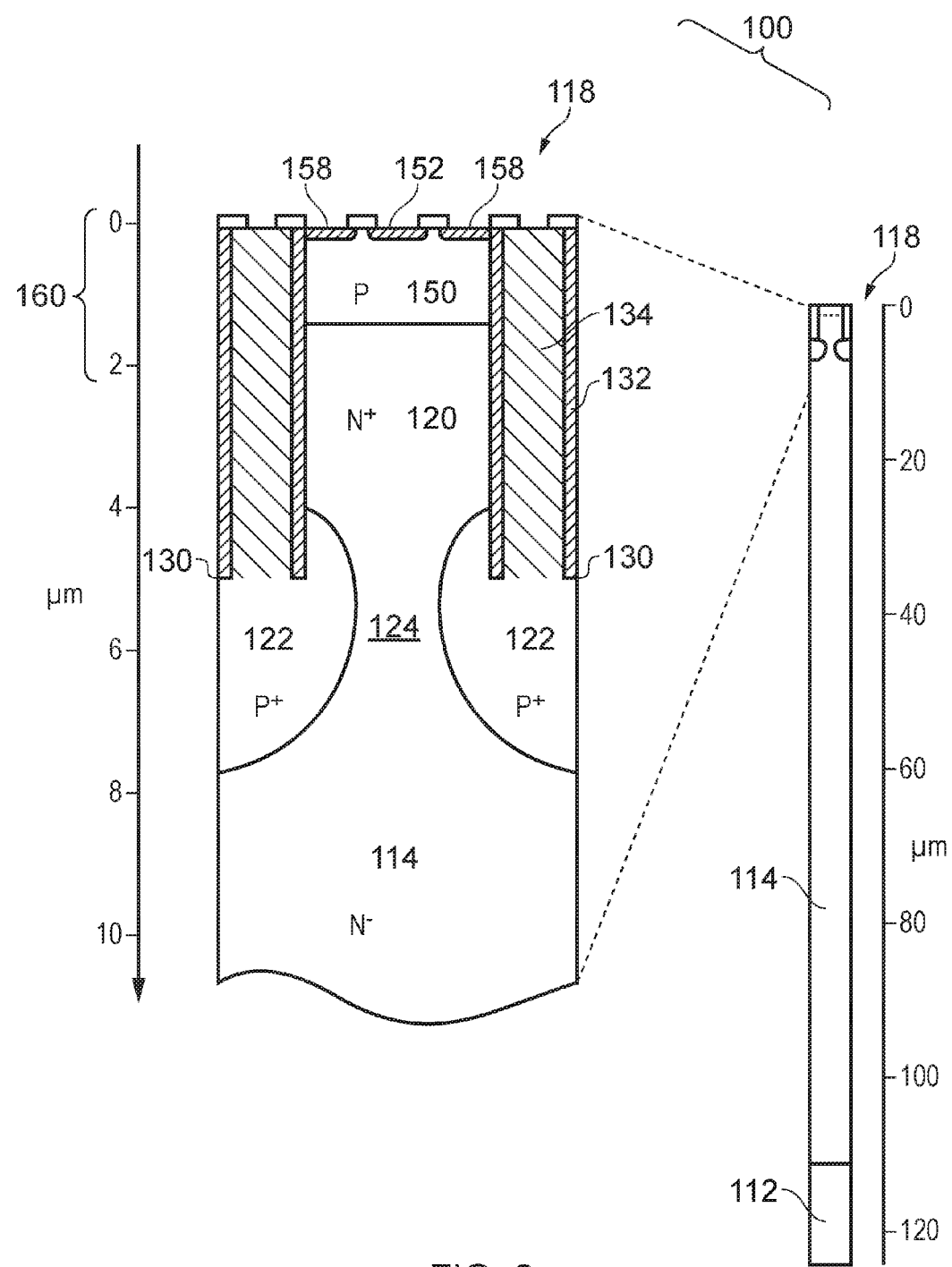
FIG. 6 is a cross section through a transistor constituting a first embodiment of this disclosure.

FIG. 6 is a cross section through an active portion of a device fabricated in accordance with this disclosure. The device, generally designated 100, forms a semiconductor switch and to a user can behave as if it was an IGBT if an input/drive FET 40 is provided, otherwise it can function like a relatively high voltage bipolar transistor with a relatively high gain. The device 100 has, in this example, been formed as a vertical device as this is an efficient way of forming a high voltage switch because the depth of the wafer can be used to set the breakdown voltage of the device 100. Thus a first layer 112 can be reasonably heavily doped, for example in the range of $10^{18}$ impurities per cubic centimeter, to form a contact region which can look as if it forms a collector of the IGBT or bipolar transistor like device 100. A layer 114 is grown over the first layer 112. This may be grown as an epitaxial layer, and in this example is an N type region that can be much like the $N^-$ region 14 that was described with respect to FIG. 1. The region 114 may be many microns thick, and in this example is about 112 microns thick so as to provide a device able to safely operate as a switch at 1200 Volts. Wafers having the configuration described so far are commercially available. An uppermost region 118 of the device is shown in expanded form in FIG. 6 but without the contacts to the semiconductor regions being shown, although gaps in the insulating layer though which the contacts extend are illustrated. The layer 114 is more lightly doped that the first layer 112, for example with a doping concentration of about $10^{13}$ donors per cubic centimeter. Layer 114 can be regarded as forming a voltage dropping region of an extended channel of a FET. Increasing the thickness of layer 114 can increase the maximum voltage the device can withstand while making the layer 114 thinner can reduce the maximum voltage.

The region 118 at the top of the device differs from the structure shown in FIG. 5 in several ways. As shown in FIG. 6, the region 118 can extend about 10 microns below a top surface of the device 100 and the device 100 and the layer 112 can be more than 100 microns below the top surface of the device 100.

An N type layer 120 is formed within the region defined (for example enclosed or encircled) by trenches 130 that are lined with a dielectric material 132 and which enclose a conductor 134 in a way which is analogous to the structures 30, 32 and 34 described with respect to FIGS. 1 and 5. However, comparing FIG. 6 to FIG. 5, it can be seen that the doped region 120 above the N type epitaxial layer 114 is not included in FIG. 5.

Another feature of the device 100 shown in FIG. 6 is the formation of, in this example, P type buried regions 122 beneath and in contact with open end portions of the insulated trenches 130. The P type layers 122 can effectively form a relatively narrow channel 124 connecting the N+ region 120 to the epitaxial N type region 114. The conductive material 134 within the insulated trenches 130 can effectively act as a conductor to a gate terminal of a FET whose channel 124 extends between region 120 and region 114. The size of the regions 122 and acceptor concentration deposited in a buried layer used to form the regions 122 and/or donor concentration in the channel 124 can be varied to control the voltage that region 112 and hence region 114 should be at compared to the gate voltage of the gate material 134 to cause the N type channel region 124 between the P type regions 122 to become depleted and hence limit the potential at the $N^+$ region 120. A P type region 150 is formed over the $N^+$ region 120 and a relatively highly doped $N^+$ region 152 is formed with the region 150. The regions 120, 150 and 152 cooperate to form a vertical NPN transistor 160.

This is another difference from the structure described with respect to FIG. 5 where a low gain PNP transistor 10 was formed throughout the body of the device. The base of the NPN transistor in FIG. 6 is significantly thinner than the base of the PNP transistor in FIG. 1, and this can give rise to higher gain, a higher frequency response but a lower break down voltage. As illustrated in FIG. 6, the base region 150 has a thickness of less than 2 microns. In other implementations, the base can have a thickness of less than 5 microns or less than 10 microns.

Figure 7:
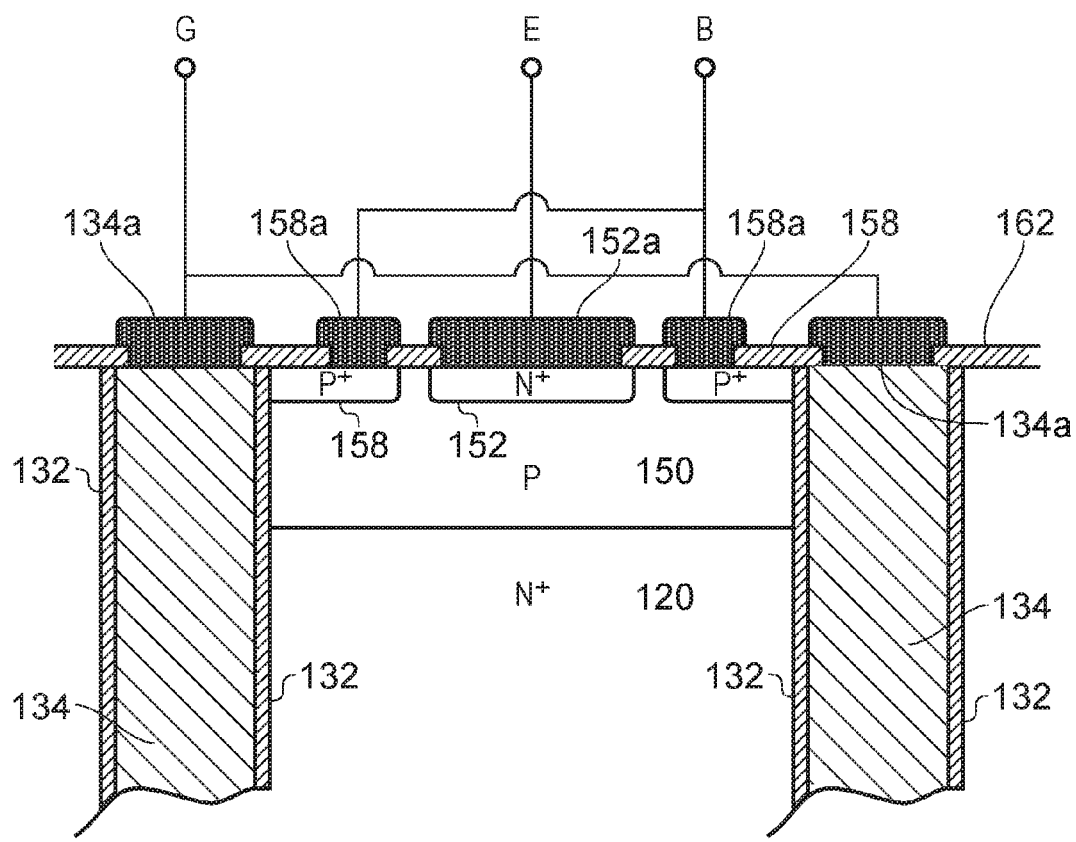
FIG. 7 is a cross section through the bipolar transistor part of a second embodiment of this disclosure.

If the device shown in FIG. 6 is to be used as a high voltage NPN transistor, then a metallic contact 152a can be made to the emitter region 152, and a metallic contact 158a can be made to the base region 150 by way of the relatively highly doped region 158, as shown in FIG. 7. In such an arrangement a further metal contact 134a can also be made to the conductive material 134 that can control the voltage of regions 122. As shown in FIG. 7, the metallic contacts 134a, 152a and 158a extend through apertures formed in a dielectric layer 162, such as an oxide layer. The formation of such a structure is within the knowledge of the person skilled in the art and is offered within the standard silicon or complementary metal oxide semiconductor (CMOS) process of many transistor fabrication facilities. For convenience the regions 134 and contacts 134a can be connected to the emitter contact 152a, for example, as shown in FIG. 15b.

The device of FIG. 7 may be formed on a die with a drive transistor located elsewhere on the die so as to emulate IGBT functionality.

Figure 8:
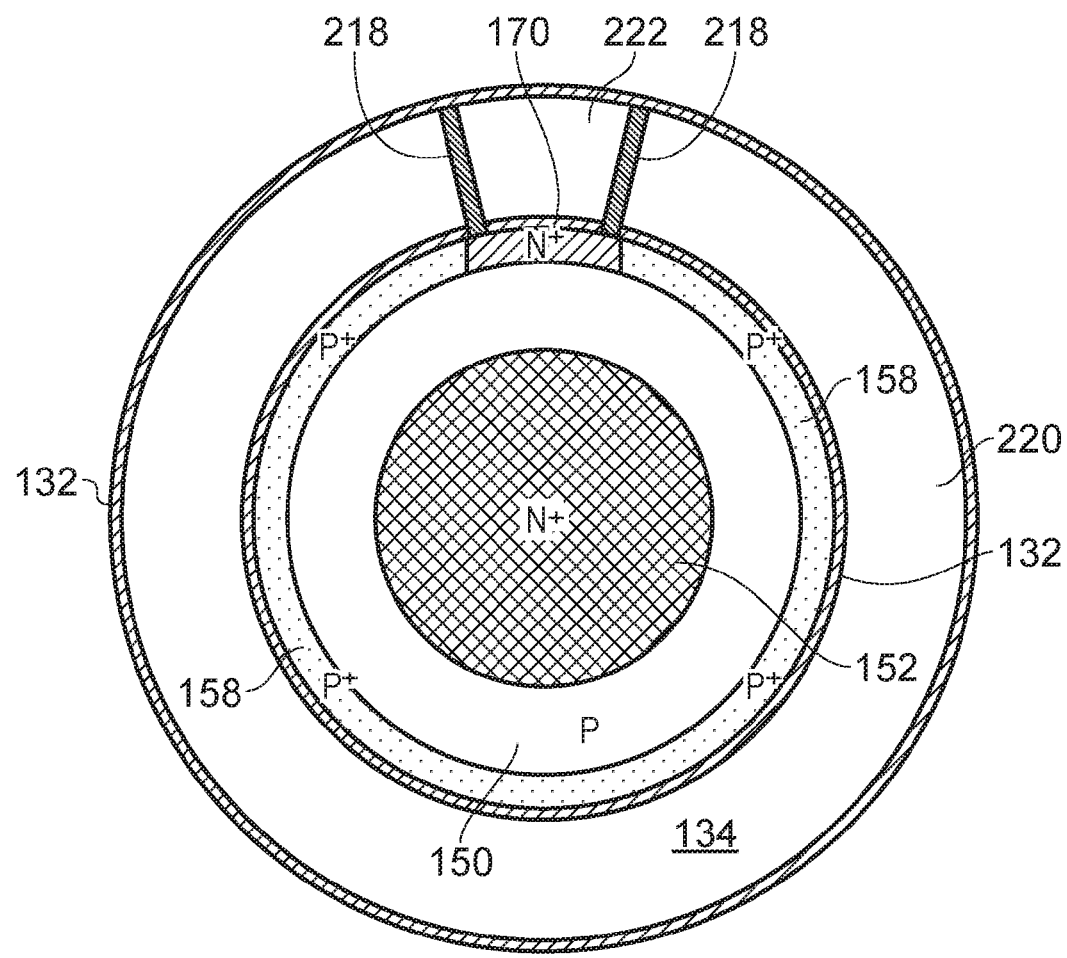
FIG. 8 is a plan view of an embodiment of this disclosure having an integrated drive FET.

However the structure shown in FIG. 6 can also have an integrated vertically formed drive FET formed therein so that an IGBT equivalent device can be formed, but with higher gain in the bipolar transistor section. This can be achieved by modifying part of the device to include a drive FET (like those shown in FIG. 3 or 5) as shown in FIG. 8.

Figure 9:
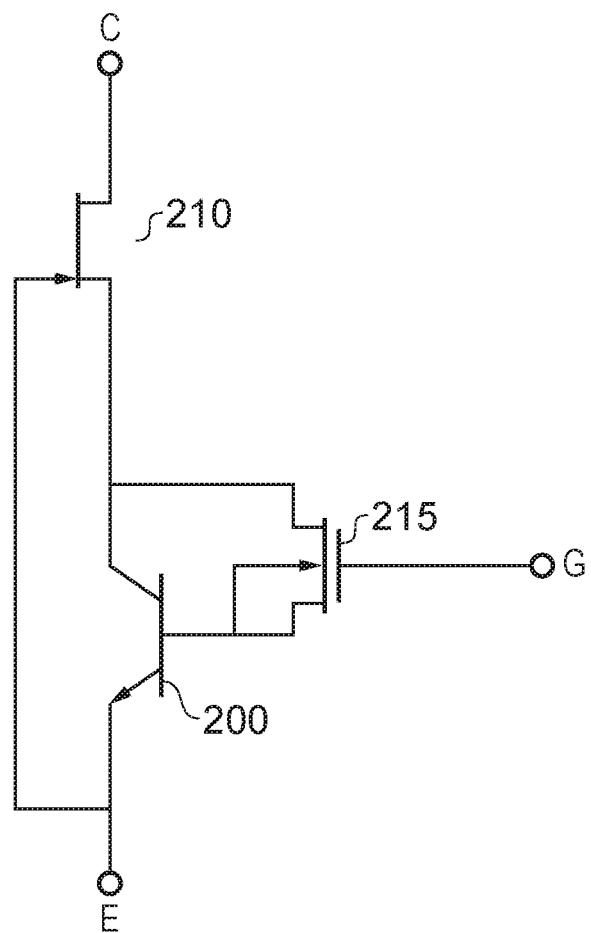
FIG. 9 is an equivalent circuit for the device shown in FIG. 6.

The drive FET can be formed by replacing the $P^+$ region 158 in some parts of the device with an $N^+$ material abutting or adjacent the wall of one or more trenches, and hence can be done at the same time as forming the emitter so this may not incur any additional processing steps. In the device shown in FIG. 8, the $N^+$ region 170 forms the source of the drive FET. The source of the drive FET, designated 215 in FIG. 9, is connected to the base of the bipolar transistor in the equivalent circuit shown in FIG. 9, and hence no measures may be taken to isolate the region 170 from the base 150/158.

Returning to FIGS. 7 and 8, the N type region 120 of the bipolar transistor also forms the drain of the drive FET 215 in these devices. In use, the drive FET opens a path for current to flow from the collector region 120 through a channel of the drive FET to region 170, where the current then flows to region 158 and hence to the base of the NPN transistor. Regions 158 and 170 may be connected to each other by way of a metal layer.

In this device structure as shown in FIG. 6 the regions 122 are arranged, in use, to fully pinch off the channel 124 when the voltage exceeds a pinch-off voltage of around 30 Volts (but the pinch off voltage could be more or could be less in other implementations) and the bipolar transistor is non-conducting. As a result the voltage across the NPN transistor 200 formed by regions 120, 150 and 152 is limited to 30 Volts or so irrespective of the potential difference across the entire device which may be over 1000 Volts.

The device can look to the user like an IGBT having a collector C and emitter E and a gate G.

To make the series FET 210 more robust, it can be advantageous to provide the series FET as a junction FET. This can avoid the formation of a gate insulating layer, as found in a metal oxide semiconductor field effect transistor (MOSFET), which might be damaged at high voltages. As a result the trench 132 of FIG. 6 is open at its bottom (orientated as shown in the Figure) such that the conductor 134 bounded by the insulating walls of the trench contacts with the P$^+$ regions 122. The conductor 134 may be provided as a metal, or it may be more P$^+$ doped silicon, such as polysilicon.

Returning to FIG. 9, it can be seen that the gate of the series FET 210 can contact with the emitter of the bipolar transistor 200. Therefore, with reference to FIG. 8, a metal contact can be made with the conducting material 134 and connected to the emitter contact. Under such circumstances, the trenched region may be sub-divided into two regions 220 and 222 by additional walls 218 as also shown in FIG. 8. The additional walls 218 can be insulating walls formed of any suitable dielectric material. The region 220 forms a via to reach the P$^+$ regions 122 of the series JFET. The region 222 adjacent the N$^+$ doping 170 acts as the gate for the control FET 215. The region 222 is bounded below the illustrated surface of the device by the insulating material of the trench such that the gate of the control/drive FET is formed in an insulating well and should not be exposed to the high voltages seen by the series FET. This can provide good insulation between the drive voltages supplied to the gate of the drive FET and the voltages switched by the transistor. However, the MOSFET style of the drive FET could be replaced by a junction FET in certain implementations.

The formation of the relatively smaller drive FET, with its smaller gate in the insulating well means that the parasitic gate capacitance associated with the drive FET 215 should be much smaller than that of a conventional IGBT. As a result transient current flows, i.e. inrush currents, at switching can be much reduced and it can be easier and less power consuming to drive the device between conducting and non-conducting states. The drive FET can be smaller because the bipolar gain can be much greater than in a conventional IGBT.

Figure 10A:
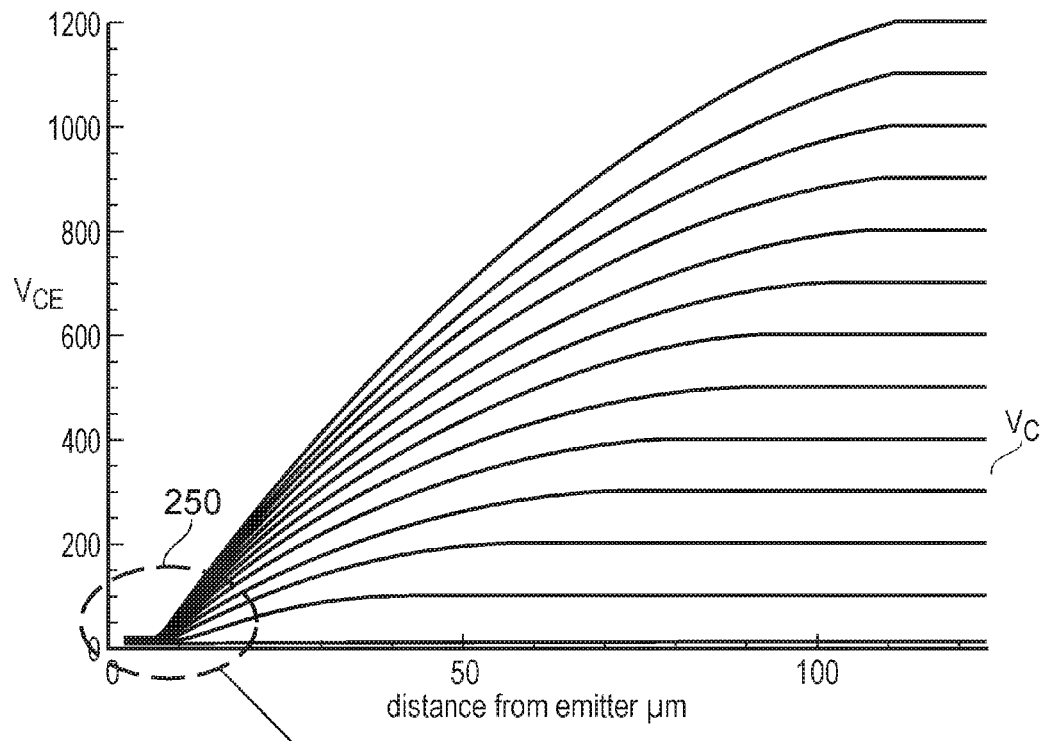
FIGS. 10a and 10b are plots of the potential within the device as a function of the distance from the top of the device of FIG. 9 for various collector voltages.
Figure 10B:
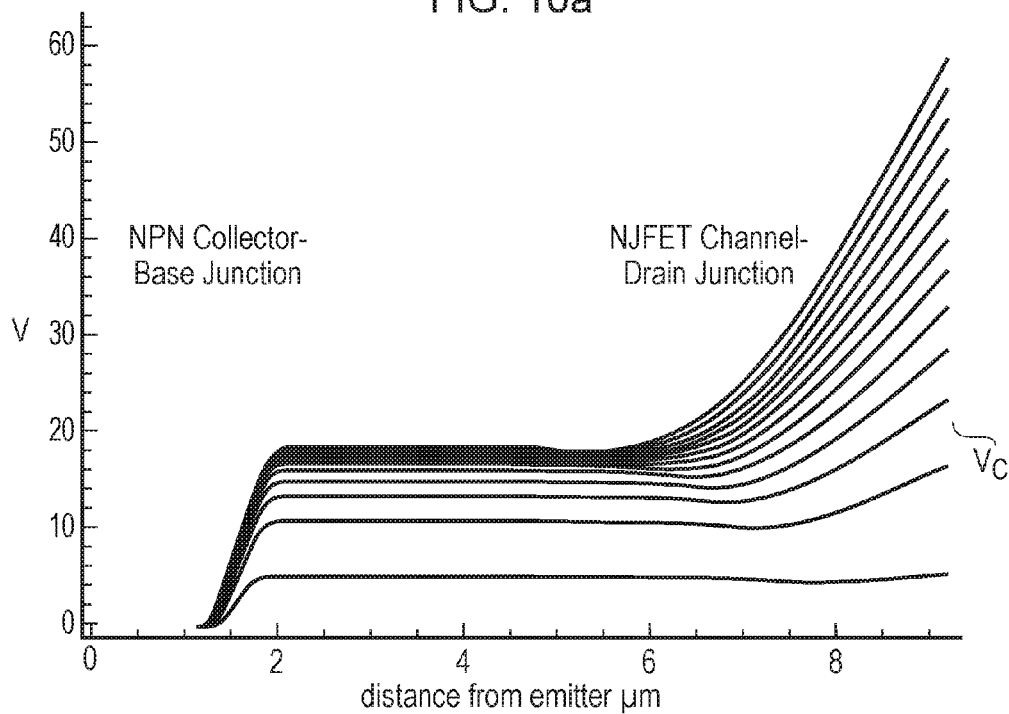

FIGS. 10a and 10b show a plot of potential within the device in accordance with FIGS. 7 to 9 as a function of distance for the device in an off state for various collector voltages Vc. FIG. 10a shows that the voltage decreases as we approach the emitter of the device, with a region 250 where the voltage between the collector and the emitter Vce of the bipolar transistor drops more quickly. The region 250 is shown in greater detail in FIG. 10b and shows that, in certain embodiments, at distances of between about 6 μm from the emitter (the center of the P$^+$ regions 122) and the edge of the base of the bipolar transistor at about 2 μm from the emitter, the voltage is limited to the pinch-off voltage of the series FET 210. Thus the NPN bipolar transistor should not be exposed to dangerous voltages.

Returning to FIG. 6, it had been indicated that the region 112 is relatively highly doped. However the type of doping had not been specified. It can be seen that a N type doping such that region 112 is N$^+$ makes a natural device structure as this then forms an N type extension to the FET. The N$^+$ doping may be in the region of $10^{19}$ or more impurities per cm$^3$.

Figure 11:
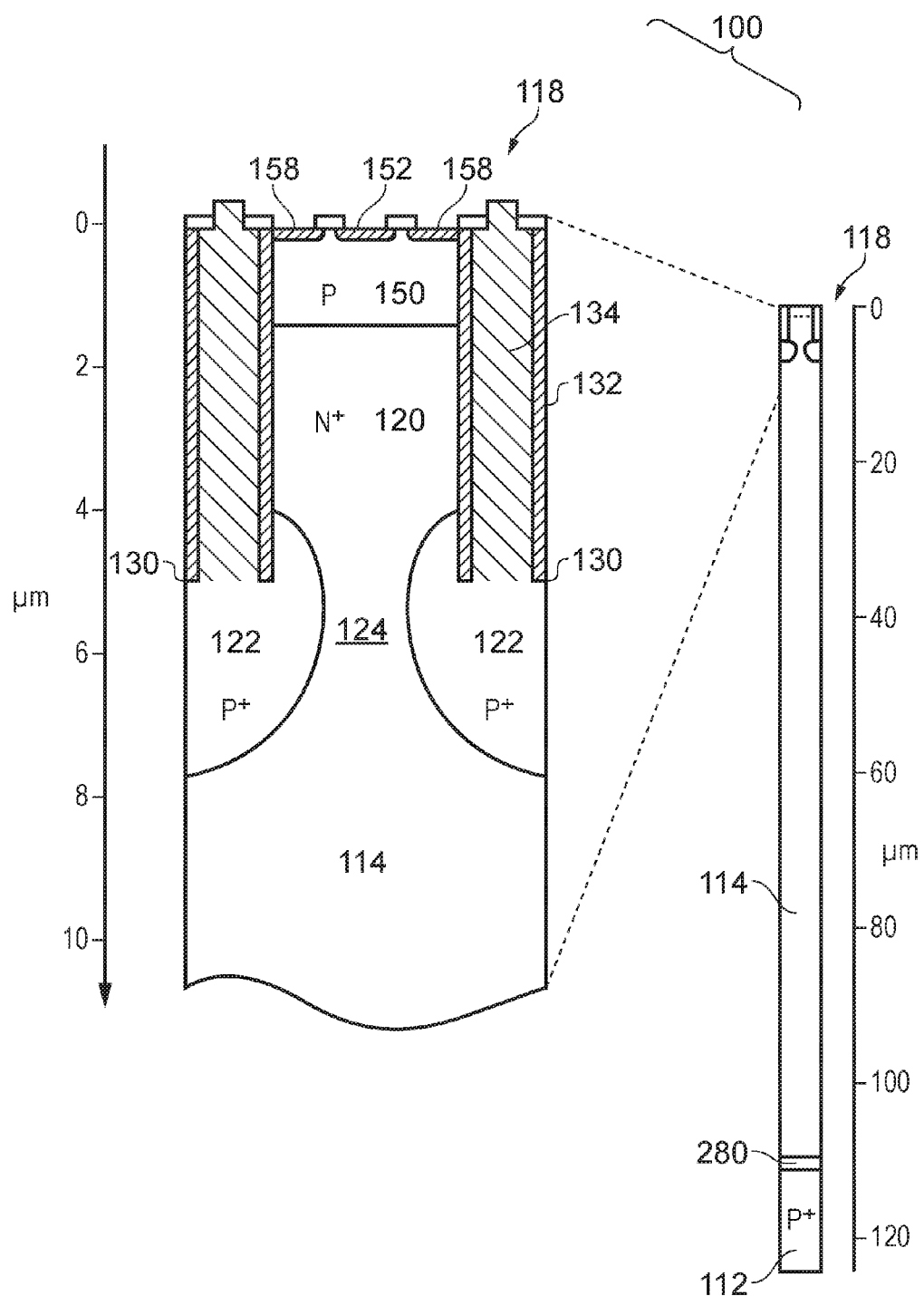
FIG. 11 shows a variation of the arrangement shown in FIG. 6.

However, and less intuitively, the region 112 may alternatively be doped to be P$^+$ thereby effectively forming a series connected PNP transistor with the FET, where the regions 122 forms the collector, region 114 forms the base and region 112 forms the emitter of the series PNP transistor. The base of the PNP transistor is electrically connected to the drain of the series FET. Such a device is shown in FIG. 11. A further region 280 may be provided intermediate the P type region 112 and the N type epitaxial layer 114. The further region 280 may be quite thin relatively to the regions 112 and 114. The further region 280 can be relatively highly N type doped to form an anti-punch through layer.

Figure 12:
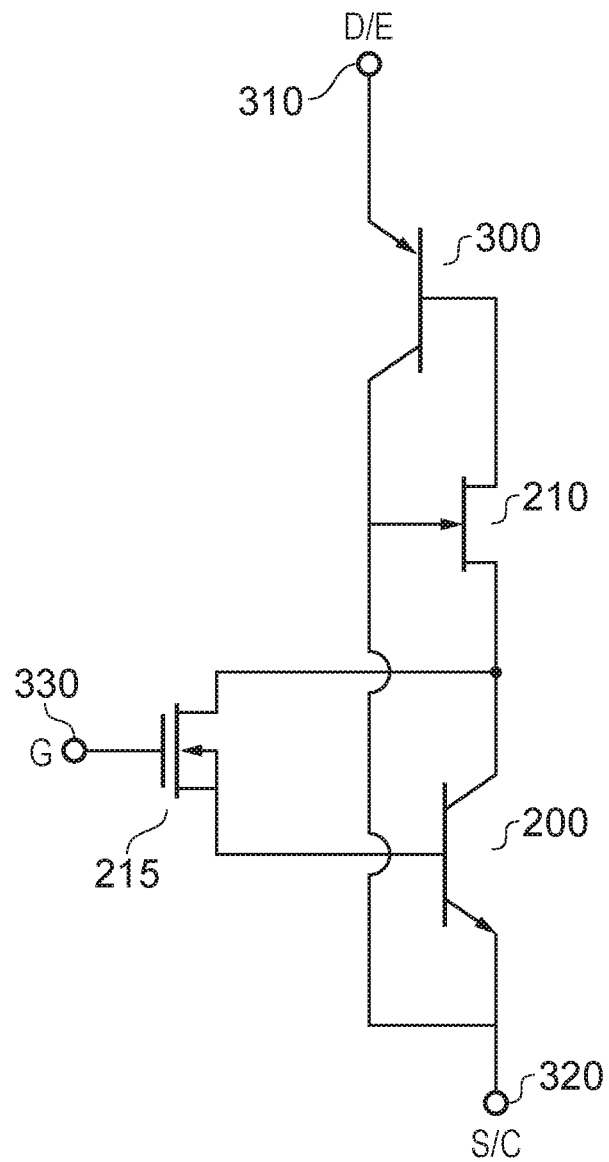
FIG. 12 is an equivalent circuit for the device shown in FIG. 11.

An equivalent circuit for the structure shown in FIG. 11 is shown in FIG. 12. Comparing FIG. 12 with FIG. 9, both Figures show an NPN transistor 200 receiving its base current by way of the input insulated gate drive FET 215. Furthermore both show that a JFET 210 is in series with the collector of the NPN transistor 200. However by including the additional P type doping a further PNP transistor 300 is formed with its emitter connected to one terminal 310 and its collector connected to terminal 320. In this device the terminal 310 can be considered as a drain or emitter, the terminal 320 is the source or collector, and terminal 330 is a gate as there is nominally no DC current at it.

This device can exhibit a higher gain as a result of two bipolar transistors acting in unison such that the current through the device Idev is given by $$I\ dev = (\beta pnp+1)*(\beta npn+1)*Imos \qquad \text{Eqn. 2}$$

where
βpnp is the gain of the PNP transistor (which can be quite low)
βnpn is the gain of the NPN transistor, and
Imos is the current flowing through the input MOSFET.

The arrangement shown in FIG. 11 has a lower on resistance than the device shown in FIG. 6 or 8 due to the carriers across the N type epitaxial layer 114 being holes, but as these are minority carriers they are slower than majority carriers and hence the device should have a slower response time that the device shown in FIG. 6 where the carriers that cross the epitaxial layer 114 are electrons and being majority carriers move more quickly through the layer 114.

Figure 13:
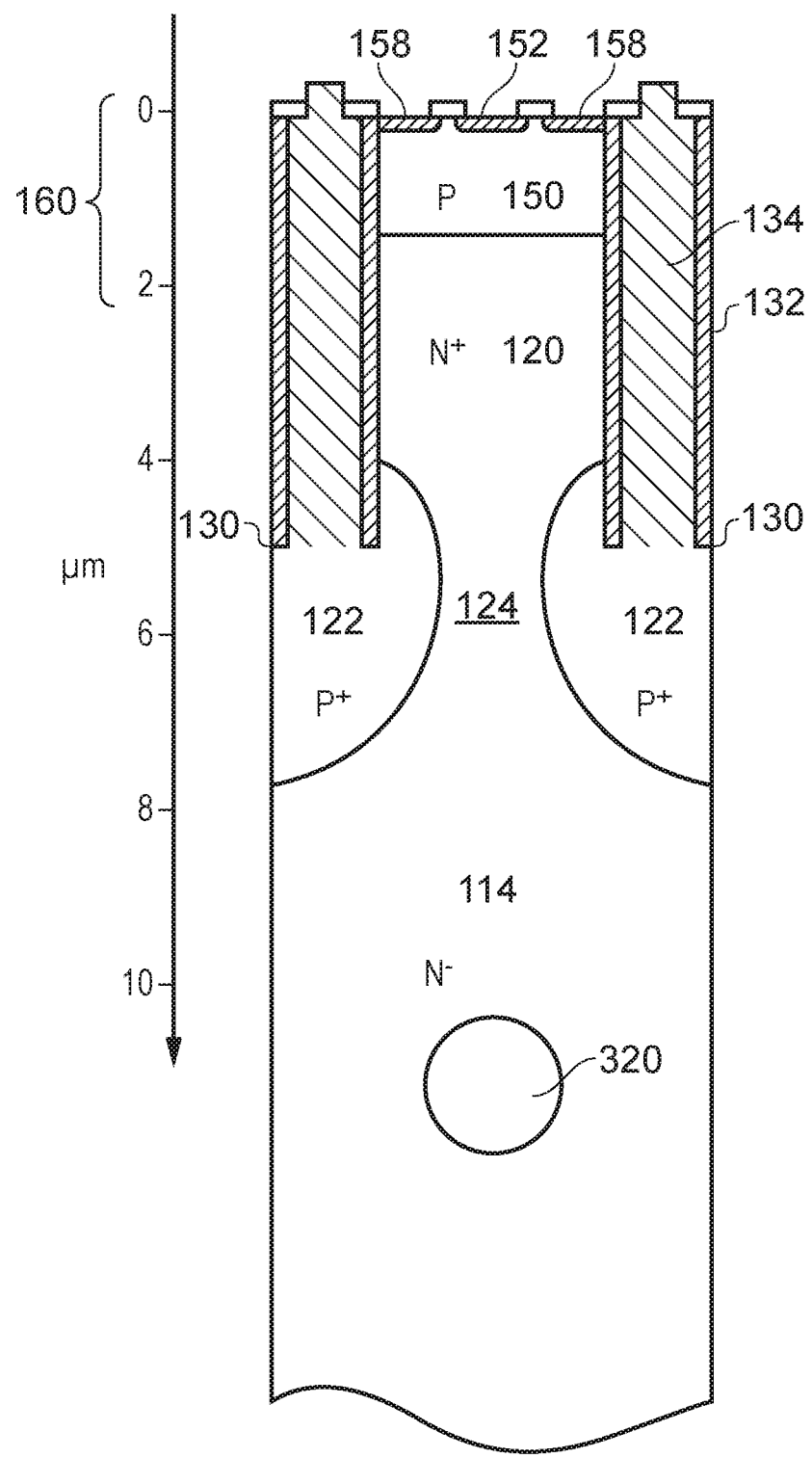
FIG. 13 is a cross section showing a further variation that can be applied to all of the embodiments.

In simulation a fairly large bipolar transistor current flows during the vertical direction midway between the trenches, and follows a similar path after the end of the trench. This has not been found to be a problem, but it may be beneficial to spread the current flow more evenly through the bulk of the transistor. This can be advanced by forming a discontinuity in the series FET a little way below the pinched off region. This can be achieved by placing a region of different doping density within the extended channel portion of the FET. Taking the arrangement of FIG. 6 as an example a small region of lower doping, designated 320 in FIG. 13, is provided to spread the current flow. A relatively small region of opposite doping can alternatively or additionally act to spread the current flow.

Figure 14:
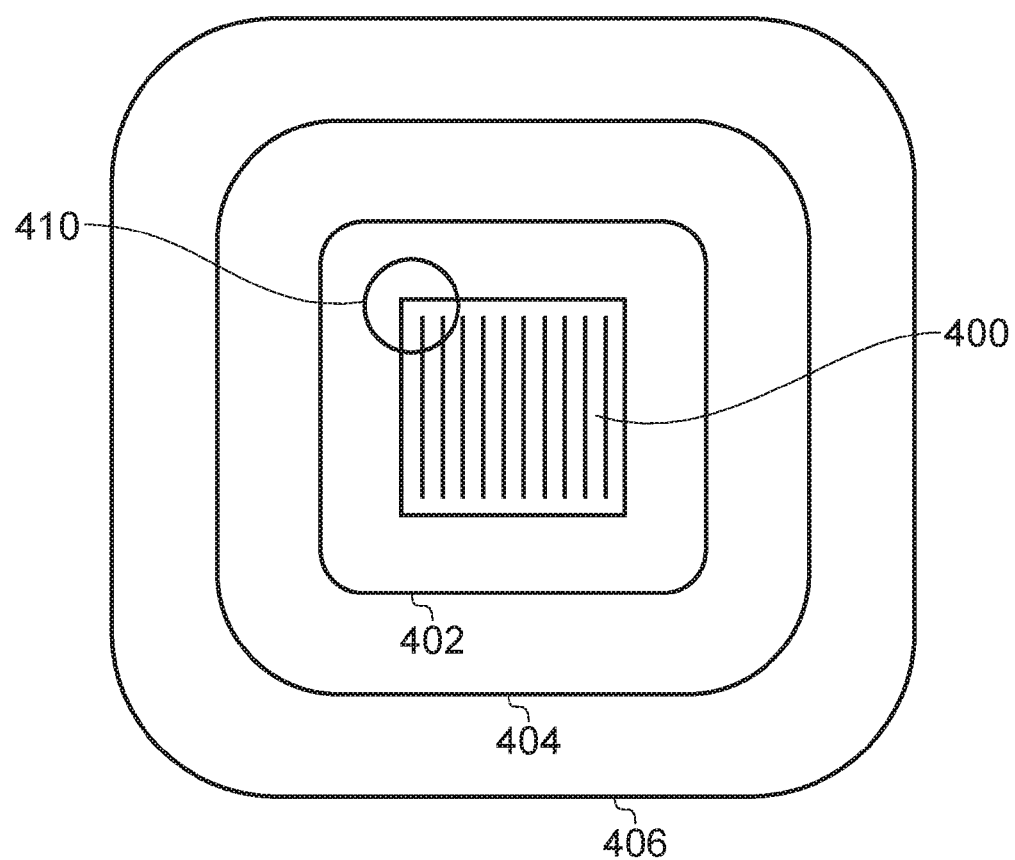
FIG. 14 is a plan view of a further device in accordance with the teachings of this disclosure.

FIG. 14 is a plan view of the upper surface of an implementation of a transistor is accordance with this disclosure. The trench region containing a plurality of linearly formed emitters and gates is generally designated 400. Floating doped trenches 402, 404 and 406 encircle the device to diminish the intensity of E fields around the device. Part 410 of the trench region 400 is shown in greater detail in FIGS. 15a and 15b. The floating doped trenches 402, 404, and 406 can surround the trench region 400 in any suitable shape.

Figure 15A:
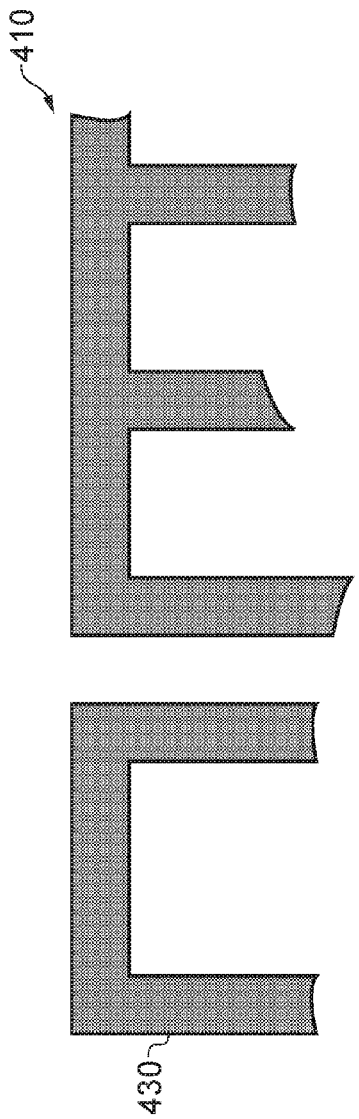
FIG. 15a shows part of the device of FIG. 14 in plan view in greater detail and FIG. 15b shows a cross section though the device.
Figure 15B:
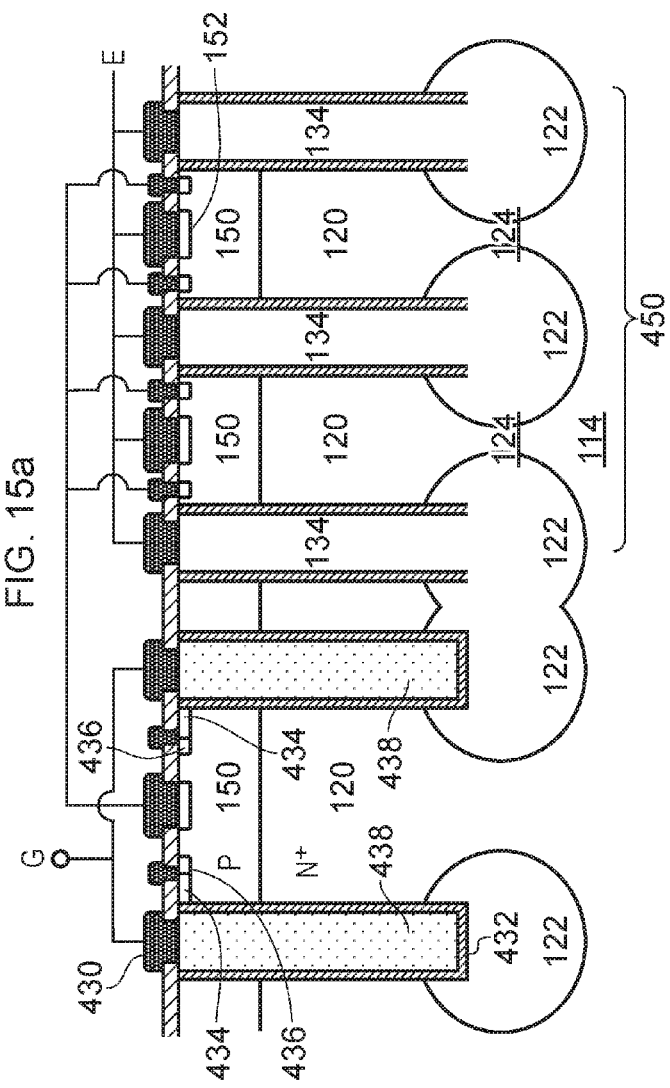

In FIGS. 15a and 15b, the expanded area 410 serves to illustrate that the drive transistor structure having trenches closed at their feet can be formed adjacent the connections to the series FET. A metal track 430 forms the connection to the control gate, being the gate of the drive transistor 215 which can have a structure similar to that described with respect to FIG. 1, except that the drive transistor can occupy only a relatively small area (e.g., about 1% of so) the device. As illustrated in FIG. 15b, the control gate 430 is connected to a trench that is closed at its base by dielectric material 432. An N+ implant 434 is formed adjacent the insulating wall of the trench and is electrically connected to a P+ implant 436 in the device of FIG. 15b. Applying a positive voltage to the control electrode 430 can cause the insulated gate material 438 in the closed trenches to deplete the P type material adjacent the trench and thereby to conduct current from the collector material 120 via a depleted channel to the N+ implant 434. From here the current may be picked off and supplied to the base regions of the IGBT, generally designated 450, or the current may be transferred to region 436 and injected into the base layer 150 of the transistor formed adjacent the drive FET and bounded by the gate 430, and this additional current which has been gained up by the bipolar transistor associated with the drive FET can be supplied to the base regions of the IGBT device. This can give a drive FET and Darlington transistor configuration, which has been illustrated in FIG. 15b. In the region 450, where a gate of the FET is connected to the same potential as the IGBT emitter, the trenches are open at their bottom so that the implant 122 can be held at the emitter voltage as discussed with respect to FIG. 6. This configuration covers the majority, for example, about 99%, of the trenched emitter/base region of the transistor.

As noted before, the series connected FET can be arranged to be "pinched off" in order to protect the bipolar transistor. The ability to pinch off the device off can depend on the depletion regions extending from each gate implant 122 being able to extend by more than about half the width of the associated channel of the device.

Figure 16:
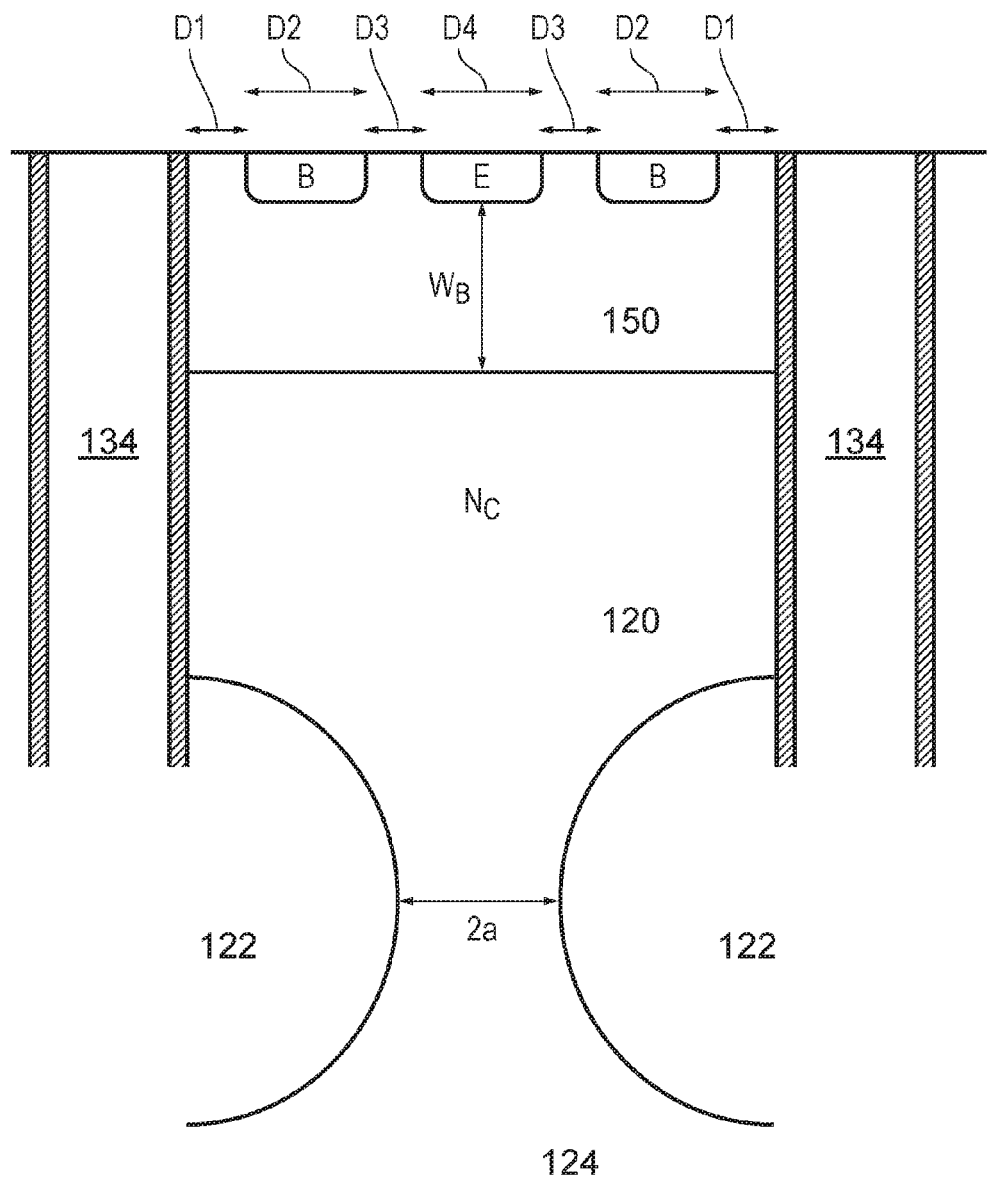
FIG. 16 shows a cross section for the purpose of discussing the device physics of an embodiment of this disclosure.

FIG. 16 shows the device structure with the base depth designated Wb and the distance between the implanted regions 122 which defines a channel width is designated 2a. The collector doping concentration is Nc in FIG. 16. In general, for good current handling a relatively highly doped collector is desired as $$J_{max} = N_c e V_{sat} \qquad \text{Eqn. 2}$$

Where $J_{max}$ is the maximum current density, e is the charge on an electron and $V_{sat}$ is the saturation voltage for the semiconductor material.

However Nc can also play a part in the pinch off voltage of the series connected FET and also in the breakdown voltage of the bipolar transistor. The pinch off voltage $V_p$ is given by $$V_p = \frac{eN_c(a^2)}{2\varepsilon_{si}} \qquad \text{Eqn. 3}$$

Where a is half the width of the transistor (half the distance between the implanted regions 122 because each region can grow with applied channel to gate voltage we can only consider the requirement for each one of the depletion regions to grow by half the channel width) and $\varepsilon_{si}$ is the permittivity of the semiconductor, generally silicon. The relative permittivity for silicon is around 11.68. Nc is an SI unit in equation 3 and hence is expressed in impurities per meter cubed. Consequently, for example, a donor concentration of and hence $10^{17}$ cm$^{-3}$ would become $10^{23}$ m$^{-3}$.

Thus increasing Nc increases the pinch off voltage, as does making the device wider.

Turning to the bipolar transistor breakdown voltage, $BV_{ceo}$ can be expressed as $$BV_{ceo} = \frac{\varepsilon_{si} E_{max}}{2eN_C} \qquad \text{Eqn. 4}$$

Where $E_{max}$ is a constant and represents the maximum E field that the material of the device can stand before breaking down and which can be related to a maximum device voltage $V_{max}$ by $$E_{max} = V_{max}/Wb \qquad \text{Eqn. 5}$$

As we want pinch off to occur before the bipolar transistor breaks down, we can write $$\frac{eN_c(a^2)}{2\varepsilon_{si}} \leq \frac{\varepsilon_{si} E_{max}}{2eN_c} \qquad \text{Eqn. 6}$$

This gives a relationship between the channel width as defined by the gap left between the regions 122, pinch off voltage, breakdown voltage and maximum current density.

To give an indication of functional device sizes, for the device shown in FIG. 16:
- 2a=1 µm (but may typically range between 0.5 µm and 3 µm);
- D1=around 0.5 µm to 0.6 µm;
- D2 is about 0.7 µm;
- D3 is approximately 0.3 µm; and
- D4 is approximately 0.7 µm.

These sizes are only given by way of example and are not limiting as other device sizes can be implemented in accordance with the principles and advantages discussed herein. The doping concentration in the channel region can be varied considerably, giving the designer considerable control of the FET pinch off voltage.

In summary, a series connected FET is provided to protect a bipolar transistor from excessive voltage, but the bipolar transistor can be used to inject carriers through the channel of the pinched off FET, so as to turn it on. This can allow a higher gain bipolar transistor to be used. The bipolar transistor by virtue of its higher gain consumes less gate current for a given device current and hence devices driving the bipolar transistor can supply less current. This allows a smaller drive FET to be used, resulting in reduced gate capacitance.

The dopings of the semiconductor regions in the embodiments discussed above can be reversed between P type and N type to form a higher gain PNP transistor in conjunction with a JFET. The transistor device has been drawn with a couple of configurations in plan view but other shapes (linear, race track, etc.) are also possible to implement in accordance with any of the principles and advantages discussed herein.

The claims presented herein are in single dependency format suitable for use at the USPTO, however it should be assumed that each claim is intended to depend on any preceding claim of the same type except where that is clearly not possible.

Aspects of this disclosure can be implemented in various electronic devices. For instance, any of the devices discussed herein can be implemented in an electronic device with a need to switch a high voltage. Such a high voltage can be at least about 100 Volts or at least about 200 Volts. In certain embodiments, the devices discussed herein can be particularly advantageous in electronic devices that switch a high voltage of at least about 1000 Volts or at least about 1200 Volts. Examples of the electronic devices can include, but are not limited to, consumer electronic products, parts of the electronic products such as packaged switch components, electronic test equipment, cellular communications infrastructure, etc. Examples of the electronic devices can include, but are not limited to, motor controllers, inverters, precision instruments, medical devices, wireless devices, appliances, vehicular electronics systems, etc. Further, the electronic devices can include unfinished products.

Unless the context clearly requires otherwise, throughout the description and the claims, the words "comprise," "comprising," "include," "including," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description of Certain Embodiments using the singular or plural number may also include the plural or singular number respectively. Where the context permits, the word "or" in reference to a list of two or more items is intended to cover all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features and/or elements. Thus, such conditional language is not generally intended to imply that features and/or elements are in any way required for one or more embodiments or that one or more embodiments necessarily include such features and/or elements.

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and devices described herein may be made without departing from the spirit of the disclosure. For example, while devices are presented in a given arrangement, alternative embodiments may perform similar functionalities with different structures, and some portions of a given device may be deleted, moved, added, subdivided, combined, and/or modified. Any suitable combination of the elements and acts of the various embodiments described above can be combined to provide further embodiments. Indeed, any of the principles and advantages discussed with reference with any of the embodiments disclosed herein can be applied in connection with any other suitable features discussed herein. The accompanying claims and their equivalents are intended to cover such forms or modifications as would fall within the scope and spirit of the disclosure.

What is claimed is:

1. A current flow control device, comprising:
a bipolar transistor; and
a vertical junction field effect transistor in series with the bipolar transistor, wherein a first region of semiconductor is shared by the bipolar transistor and the vertical junction field effect transistor, wherein the vertical field effect transistor comprises a buried region of doped semiconductor in physical contact with a conductor disposed between insulating walls, wherein the vertical junction field effect transistor has a pinch off voltage and is configured to limit a voltage across the bipolar transistor to the pinch off voltage.

2. A current flow control device as claimed in claim 1, wherein the first region forms a collector of the bipolar transistor and a drain of the vertical junction field effect transistor.

3. A current flow control device as claimed in claim 2, wherein the collector of the bipolar transistor is bounded by insulating trenches and connects with a less doped region of semiconductor that forms an extended channel of the vertical junction field effect transistor, wherein the insulating trenches include the insulating sidewalls.

4. A current flow control device as claimed in claim 3, wherein an emitter region and a base region of the bipolar transistor are bounded by the insulating trenches.

5. A current flow device as claimed in claim 1, wherein the bipolar transistor is an NPN device.

6. A current flow device as claimed in claim 1, wherein the buried region of doped semiconductor and another buried region comprise an opposing type of semiconductor to that of a collector of the bipolar transistor and are formed to encircle a carrier flow path from the bipolar transistor, the buried region and the another buried region configured to modulate a channel width of the vertical junction field effect transistor.

7. A current flow control device as claimed in claim 1, wherein a connection to a gate region of the vertical junction field effect transistor is by way of the conductor.

8. A current flow control device as claimed in claim 1, further comprising a discontinuity formed in a channel of the vertical junction field effect transistor so as to cause carriers to disperse within the channel.

9. A current flow control device as claimed in claim 1, wherein the device further comprises a drive field effect transistor integrated with the bipolar transistor to provide a base current for the bipolar transistor.

10. A current flow control device as claimed in claim 9, wherein a doped region for a source of the drive field effect transistor abuts or is electrically connected by another conductor to a doped region forming a base of the bipolar transistor.

11. A current flow control device as claimed in claim 1, wherein the bipolar transistor is configured to inject carriers into a depleted region of the vertical junction field effect transistor to initiate current flow when the vertical junction field effect transistor is pinched off.

12. A current flow control device as claimed in claim 1, wherein the vertical junction field effect transistor comprises a vertical channel, wherein the vertical channel is bounded by opposing regions of semiconductor and a separation between the opposing regions and a doping concentration within the vertical channel define the pinch off voltage.

13. A current flow control device as claimed in claim 1, further comprising a drive field effect transistor configured to provide a base current to the bipolar transistor, wherein the drive field effect transistor comprises a gate in an insulating well that is separated from the conductor by additional insulating walls.

14. A current flow control device as claimed in claim 9, wherein the drive field effect transistor is a metal oxide semiconductor field effect transistor.

15. A current flow control device comprising:
an emitter region connected to a first current flow node;
a collector region connected to a second current flow node, wherein the collector region is spatially extended; and
buried doped regions abutting a spatially extended portion of the collector region, the buried doped regions being in physical contact with a conductor disposed between insulating sidewalls, the buried doped regions arranged so as to cause a portion of the spatially extended portion of the collector region to pinch off when a collector voltage exceeds a first value, and where a base region and the emitter region are operable in response to a base current to inject carriers into the pinched off portion of the spatially extended collector region to cause a current to flow.

16. A current flow device as claimed in claim 15, wherein the buried doped regions are oppositely doped to the adjacent regions of the spatially extended portion of the collector region and, in use, form a vertically formed junction field effect transistor.

17. A current flow control device as claimed in claim 15, wherein the current flow device is an insulated gate bipolar transistor.

18. A current flow control device as claimed in claim 17, in which a base of the insulated gate bipolar transistor is connected to a different node than a gate of a vertical junction field effect transistor of the insulated gate bipolar transistor.

19. A current flow control device comprising:
a bipolar transistor;
a vertical junction field effect transistor in series with the bipolar transistor, wherein a first region of semiconductor is shared by the bipolar transistor and the vertical junction field effect transistor, wherein the vertical field effect transistor comprises a conductor disposed between insulating walls of a first trenched region and in physical contact with a buried region of doped semiconductor, wherein the vertical junction field effect transistor has a pinch off voltage and is configured to limit a voltage across the bipolar transistor to the pinch off voltage; and
a drive field effect transistor configured to provide a base current to the bipolar transistor, wherein the drive field effect transistor comprises a gate in an insulating well in a second trenched region, wherein additional insulating walls separate the first trenched region and the second trenched region.

20. A current flow control device as claimed in claim 19, wherein the first trenched region and the second trenched region encircle the bipolar transistor in a plan view.

* * * * *